(12) United States Patent
Aritome

(10) Patent No.: US 7,751,236 B2
(45) Date of Patent: Jul. 6, 2010

(54) MEM SUSPENDED GATE NON-VOLATILE MEMORY

(75) Inventor: Seiichi Aritome, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/398,789

(22) Filed: Mar. 5, 2009

(65) Prior Publication Data

US 2009/0196106 A1     Aug. 6, 2009

Related U.S. Application Data

(62) Division of application No. 11/513,581, filed on Aug. 31, 2006, now Pat. No. 7,511,994.

(51) Int. Cl.
*G11C 11/34* (2006.01)
*G11C 16/04* (2006.01)

(52) U.S. Cl. .................. 365/185.01; 257/316; 257/318

(58) Field of Classification Search ............ 365/185.01, 365/51; 257/314, 315, 316, 318
See application file for complete search history.

(56) References Cited

U.S. PATENT DOCUMENTS

| 6,509,605 | B1 * | 1/2003 | Smith ....................... 257/316 |
| 6,611,033 | B2 | 8/2003 | Hsu et al. |
| 7,045,843 | B2 | 5/2006 | Goto et al. |
| 7,050,320 | B1 | 5/2006 | Lai et al. |
| 7,158,281 | B2 * | 1/2007 | Chen et al. .................. 359/291 |
| 2004/0251906 | A1 | 12/2004 | Staple et al. |
| 2005/0227428 | A1 * | 10/2005 | Mihai et al. ................. 438/222 |
| 2006/0255395 | A1 | 11/2006 | Fujita et al. |

OTHER PUBLICATIONS

N. Abele, et al. "Suspended-Gate MOSFET: bringing new MEMS functionality into solid-state MOS transistor," IEEE, 2005, pp. 19.6.1-19.6.3.

* cited by examiner

*Primary Examiner*—VanThu Nguyen
(74) *Attorney, Agent, or Firm*—Leffert Jay & Polglaze, P.A.

(57) ABSTRACT

A carrier storage node such as a floating gate is formed on a moving electrode with a control gate to form a suspended gate non-volatile memory, reducing floating gate to floating gate coupling and leakage current, and increasing data retention.

25 Claims, 7 Drawing Sheets

MEM SUSPENDED GATE NON-VOLATILE MEMORY

RELATED APPLICATION

This application is a divisional of U.S. application Ser. No. 11/513,581, titled "MEM SUSPENDED GATE NON-VOLATILE MEMORY," filed Aug. 31, 2006, now U.S. Pat. No. 7,511,994 (allowed), which is commonly assigned and incorporated herein by reference

FIELD

The present disclosure relates generally to suspended gate memories and in particular the present disclosure relates to suspended gate non-volatile memories.

BACKGROUND

In standard non-volatile memory, especially flash memory, data retention is an important characteristic. In general, data retention failure is due to charge loss from floating gates (i.e., storage nodes) of the memory. There are many causes of charge loss, including tunnel oxide leakage, detrapping, mobile ions in inter-dielectric layer, and the like. These are all related phenomena of materials surrounding the floating gate.

On the other hand, micro-electro-mechanical (MEM) moving electrode devices are becoming more and more common. In a MEM device, the moving node is used as a gate of a metal oxide semiconductor (MOS) transistor, and has a very sharp threshold.

For the reasons stated above, and for other reasons stated below which will become apparent to those skilled in the art upon reading and understanding the present specification, there is a need in the art for improved data retention in memories.

DETAILED DESCRIPTION

Figure 1:
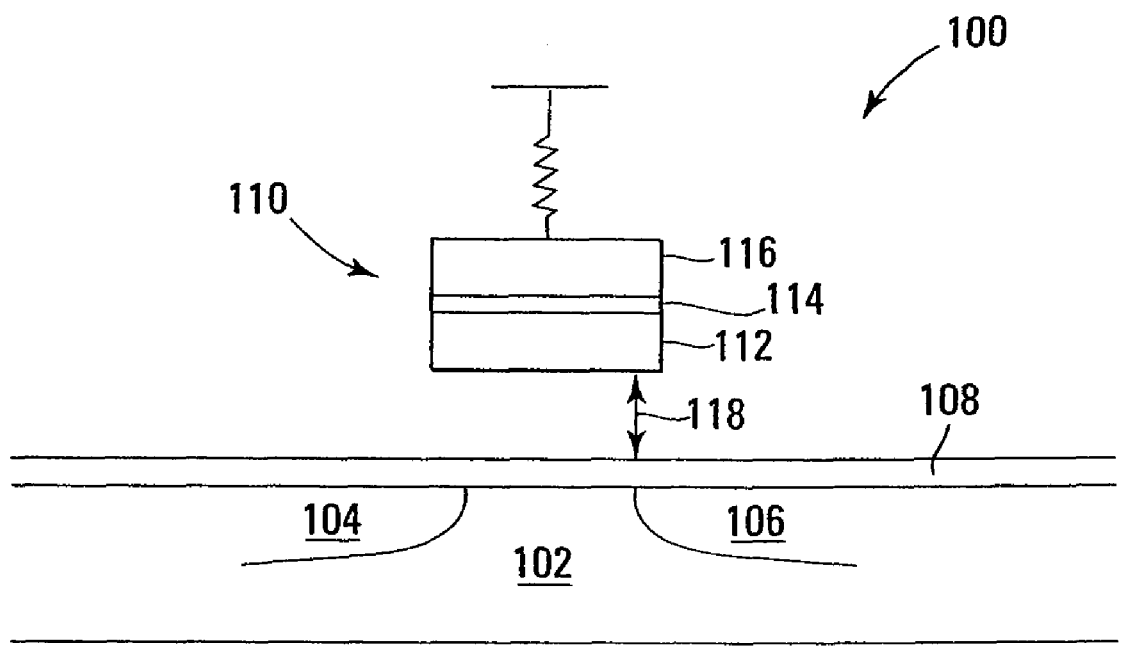
FIG. 1 is a side elevation view of a suspended gate non-volatile memory cell perpendicular to a control gate, and in a non-operation position according to one embodiment.

In the following detailed description of the embodiments, reference is made to the accompanying drawings that form a part hereof. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present disclosure is defined only by the appended claims, along with the full scope of equivalents to which such claims are entitled.

The embodiments of the present invention include a non-volatile memory with a carrier storage node normally separated or floated from a substrate and a tunnel oxide. For operation of the memory, for example for read, erase, or program operations, the carrier storage node is movable to contact the tunnel oxide and substrate. Due to separation of the carrier storage node from the surrounding material in a normal, non-operating state, leakage current from the carrier storage node is suppressed, and data retention performance is improved. For purposes of this disclosure, a suspended gate structure is one in which a metal gate or gate structure is suspended over a substrate by supporting arms. Pull-in voltage on a pull-in/pull-out gate causes the suspended structure to deflect toward the substrate, and pull-out voltage on the pull-in/pull-out gate causes the suspended structure to deflect away from the substrate.

Figure 2:
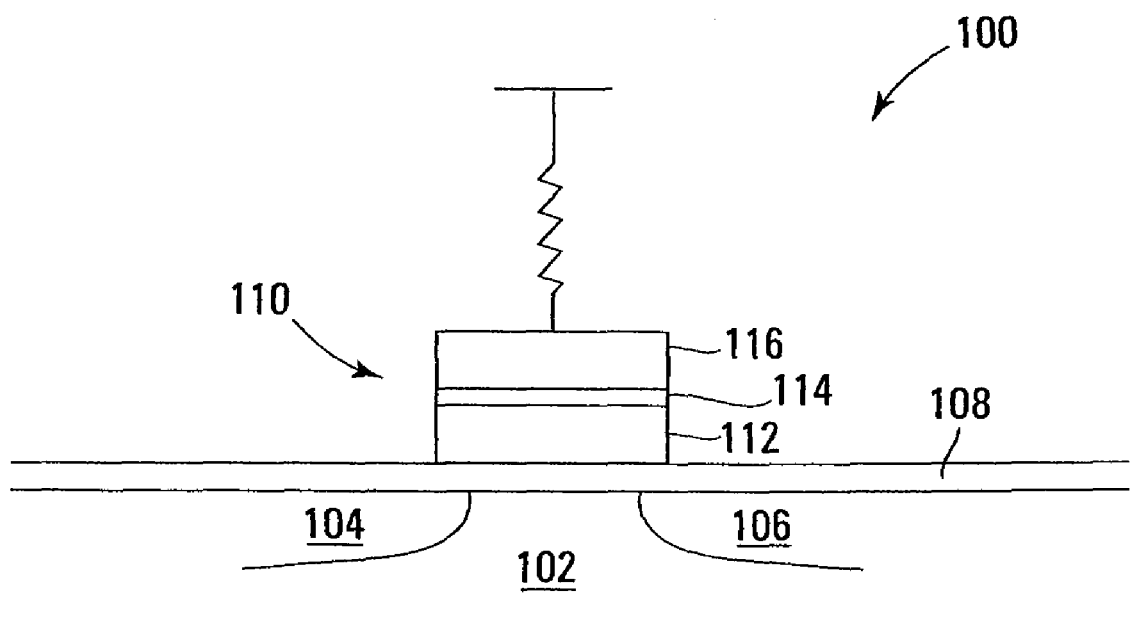
FIG. 2 is a side elevation view of the suspended gate non-volatile memory cell of FIG. 1 in an operation position according to another embodiment.

A MEM suspended gate non-volatile memory cell 100 of one embodiment is shown in side elevation in FIG. 1. The cell 100 comprises a substrate 102 having source 104 and drain 106 regions, and a tunnel oxide 108 over the substrate 102, source 104, and drain 106 regions. A suspended structure 110 has a carrier storage node (or floating gate) 112, a dielectric 114, and a control gate 116. The suspended structure 10 is movable between a first position as shown in FIG. 1, with an air or vacuum gap 118 between the carrier storage node 112 and the tunnel oxide 108, and a second position in which the suspended structure carrier storage node 112 contacts the tunnel oxide 108 (shown in FIG. 2).

Figure 3:
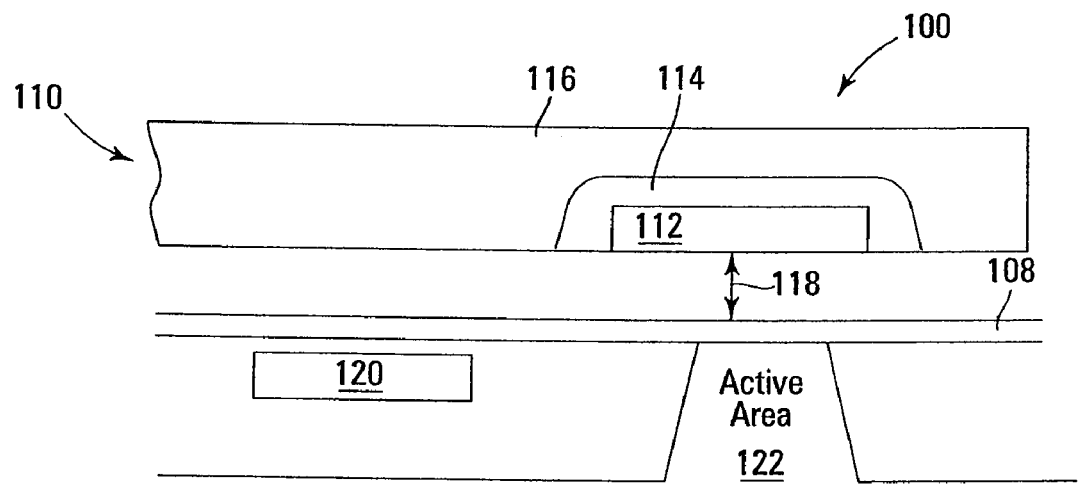
FIG. 3 is a side elevation view parallel to a control gate of the suspended gate non-volatile memory cell of FIG. 1.

The motion of the suspended structure 110 between the first, or normal non-operating, position, and the second, or operating position, is controlled by the application of certain potentials to various components of the memory cell 100. Referring now also to FIG. 3, in one embodiment, the motion of the structure 110 is controlled in part by the voltage applied to a pull-in/pull-out gate (PPG) 120. The PPG 120 is formed in the substrate 102 and is typically positioned as shown in FIG. 3. Application of a voltage to the PPG 120, combined with voltages applied to the source, drain, control gate, and substrate, allow the cell to operate in various operational states, such as read, program, and erase. Pull-in operation is when the suspended portion 110 is in the second (or operation) position as described above, and pull-out is when the suspended portion 110 is in the first (or non-operation) position as described above.

Figure 4:
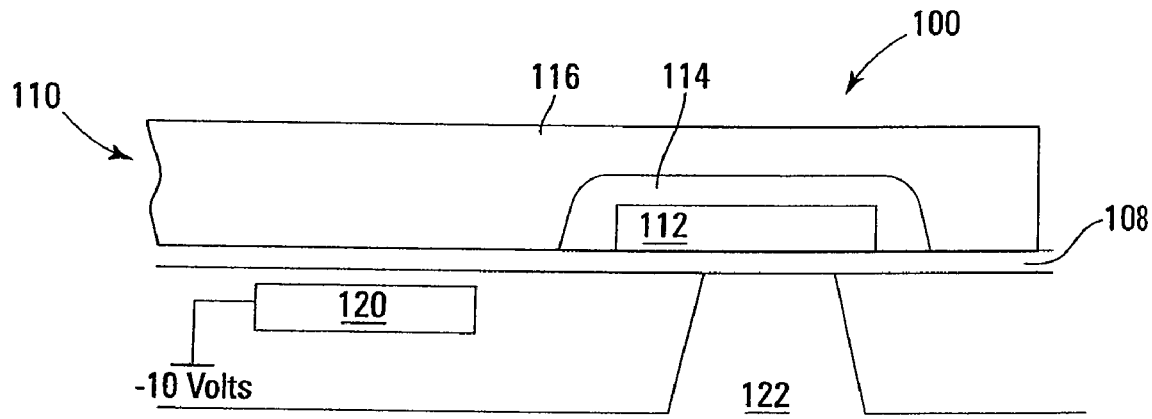
FIG. 4 is a view of a read operation position of the memory cell of FIG. 3.
Figure 5:
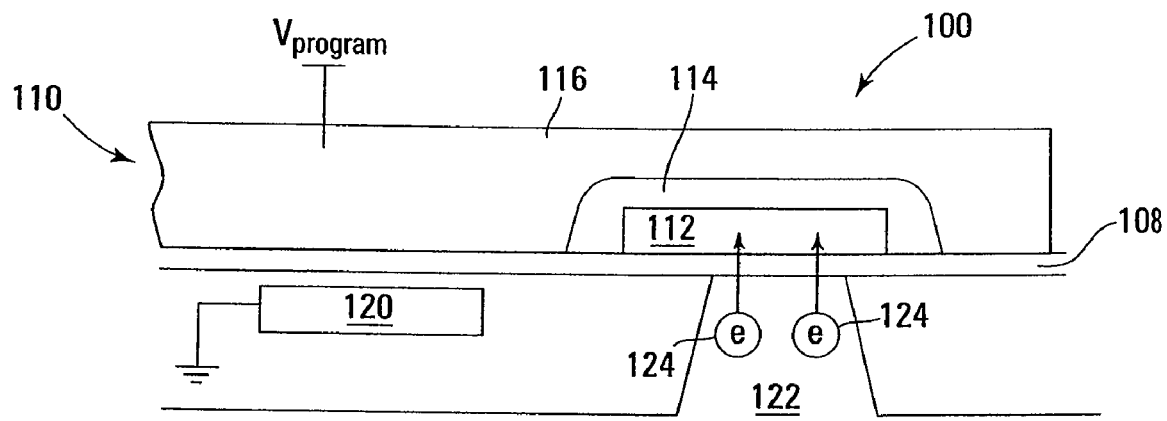
FIG. 5 is a view of a program operation position of the memory cell of FIG. 3.

For example, one set of voltages for reading a non-volatile suspended gate memory cell such as cell 100 applies 0 volts to the control gate 116, substrate 102, and source 104, 1.0 volt to the drain 106, and −10 volts to the PPG 120. This pulls in the suspended portion 110 to the tunnel oxide 108, and allows a data read of the carrier storage node 112. This is shown in FIG. 4.

To program a memory cell such as cell 100, one set of voltages applies a program voltage (for example, 20 volts) to the control gate 116, 0 volts to the PPG 120 and substrate 102, and either 0 volts to the source 104 and drain 106 for a selected cell, versus 10 volts to the source 104 and drain 106 for an unselected cell. This combination of voltages pulls in the suspended portion 110 to contact the tunnel oxide, and injects electrons 124 from an active area 122 into the carrier storage node 112, programming the cell 100.

To erase a memory cell such as cell 100, the source 104 and drain 106 are left floating, the control gate 116 is biased to 0 volts, the PPG 120 to −10 volts, and the substrate to 20 volts. This set of voltages pulls in the suspended portion 110 to contact the tunnel oxide 108, and ejects electrons 124 from the carrier storage node 112 to the substrate 102.

When no operations are to be performed on the cell, the suspended portion 110 is separated from the tunnel oxide 108 by the gap 118, with the PPG setting for pull-out of the suspended portion 110 from the tunnel oxide 108. The gap 118 provides increased data retention by separating the carrier storage node 112 from surrounding materials that can be possible leakage locations.

The voltages discussed above with respect to read, program, erase, and no operation are one set of voltages applicable to use of memory cells such as memory cell 100 in a NAND configuration. Different read/program erase operations and voltages are used for other types of memory cells, for example, NOR flash.

Memory arrays according to various embodiments include a memory cell array, such as a NAND flash array, NOR flash array, or virtual grand array. Each memory cell has a bit line, source line, and control gate which is in an air gap or vacuum gap. Floating gate to floating gate interference is reduced, and parasitic capacitance on bit lines and word lines is reduced. High performance operation therefore is possible. An array of suspended gate MEM non-volatile memory cells is shown in FIGS. 6, 7, 8, which show, respectively, a top view, a first cross-sectional view, and a second cross-sectional view of an array 600 of non-volatile suspended gate memory cells.

Figure 6:
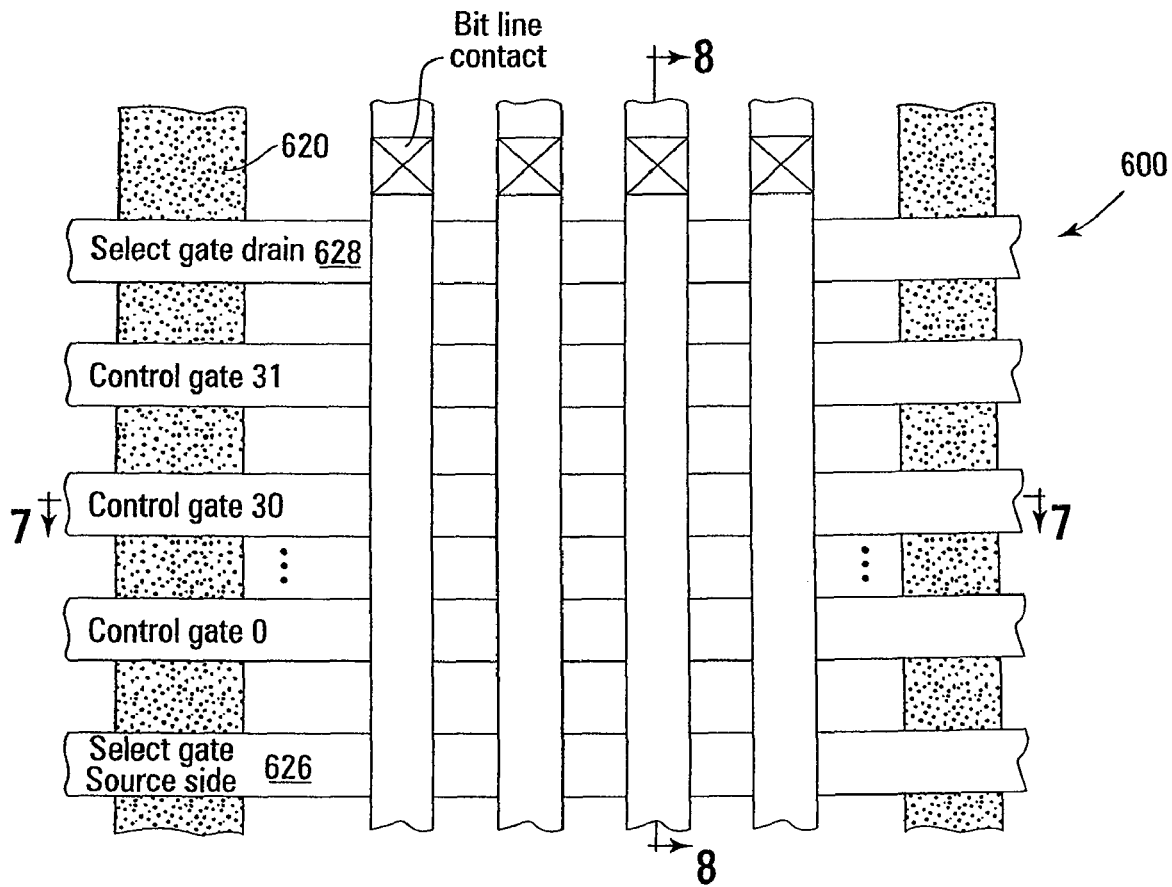
FIG. 6 is a top view of a memory array of suspended gate non-volatile memory cells.
Figure 7:
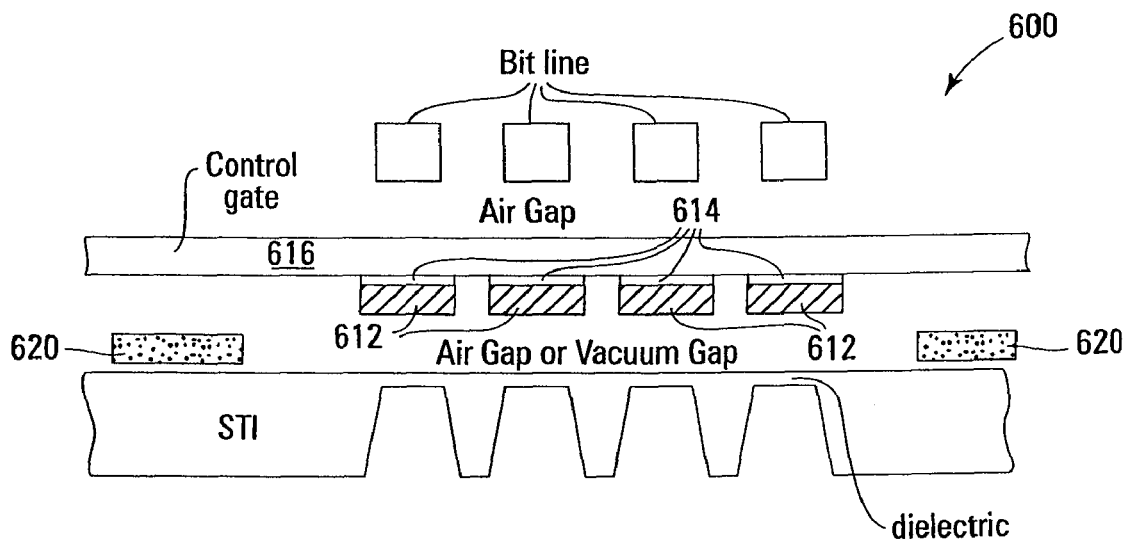
FIG. 7 is a cross-sectional view of the memory array of suspended gate non-volatile memory cells taken along line 7-7 of FIG. 6.
Figure 8:
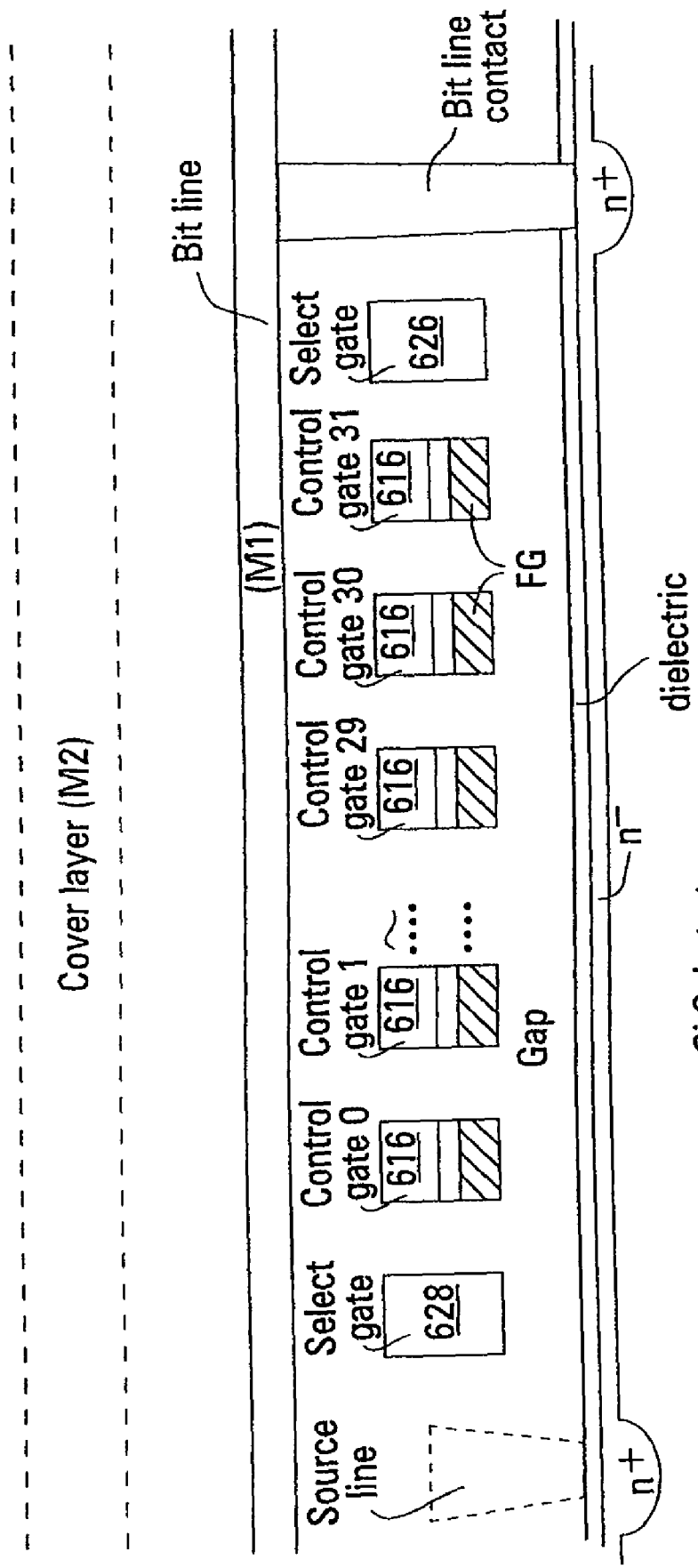
FIG. 8 is a cross-sectional view of the memory array of suspended gate non-volatile memory cells taken along line 8-8 of FIG. 7.

Referring to FIGS. 6, 7, and 8, an array 600 of non-volatile memory cells such as cells 100 is shown. The cells of the array have a suspended structure including a common control gate (control gates labeled 616) for each of a plurality of wordlines of the array, each wordline having associated with it a plurality of carrier storage nodes (floating gates) 612 controlled by the common control gate, and separated therefrom by a dielectric 614. Bitlines run perpendicular to the wordlines. A combination of voltages applied to the bitlines and wordlines allows operation of the array. Operation of the array is similar to that of an individual cell, but since a common control gate is used, the voltages applied are different from those used for operation of a single cell. Further, in an array configuration, certain cells are selected or unselected, and require select gates. The general operation of select gates in a NAND array is known and will not be discussed further herein.

For operation of a non-volatile suspended gate array such as array 600, one set of voltages is as follows. For non-operation, that is when no operations such as read, program, or erase are being performed on the array, the array is maintained with all of the suspended portions of the cells in their pull-out position. In this configuration, the PPGs are grounded.

In one embodiment, a set of voltages for operations on the array are as follows. When a read operation is desired on a cell, the PPG 620 for the cell is biased to −10 volts. The source and well (substrate) are biased to 0 volts, the bit line to 1 volts, and the select gates 626 and 628 for source and drain are biased to 3.5 volts. For a selected cell, the control gate associated with that cell is biased to 0 volts, and for unselected cells, the control gate is biased to 5 volts. This pulls in the selected carrier storage node for a read operation on the selected cell.

To program a memory cell of an array such as array 600, one set of voltages applies a program voltage (for example, 20 volts) to the control gate of the selected cell, a pass voltage, that is the voltage applied to non-programming word lines to allow their cells to act as pass transistors, (for example, 10 volts) to the control gate of unselected cells, −10 volts to the PPG, 0 volts to the source select gate and the substrate, 1.8 volts to the source, 2.5 volts to the drain select gate, and either 0 volts (selected) or 1.8 volts (unselected) to bitlines, depending upon whether the cell is to be programmed or not. This set of voltages pulls in the selected carrier storage node for programming.

To erase a memory cell of an array such as array 600, one set of voltages leaves the bitline, source and drain select gates, and the source floating, applies 0 volts to the control gates, −10 volts to the PPG, and 20 volts to the substrate or p-well of the array. This set of voltages pulls in the selected carrier storage node for an erase operation on the block to be erased.

It should be understood that the voltages described herein are representative of voltages that are amenable to the operations of the non-volatile suspended gate memories and arrays described herein, but that other sets of voltages will also work for the operations of the various embodiments. Still further, it should be understood that other array structures, such as NOR flash and virtual grand array structures are also amenable to use with the suspended carrier storage node embodiments described herein.

The suspended gate non-volatile memory cells and memory arrays described herein provide, for example, good data retention, reduced floating gate coupling, and reduced bitline to bitline coupling.

Figure 9:
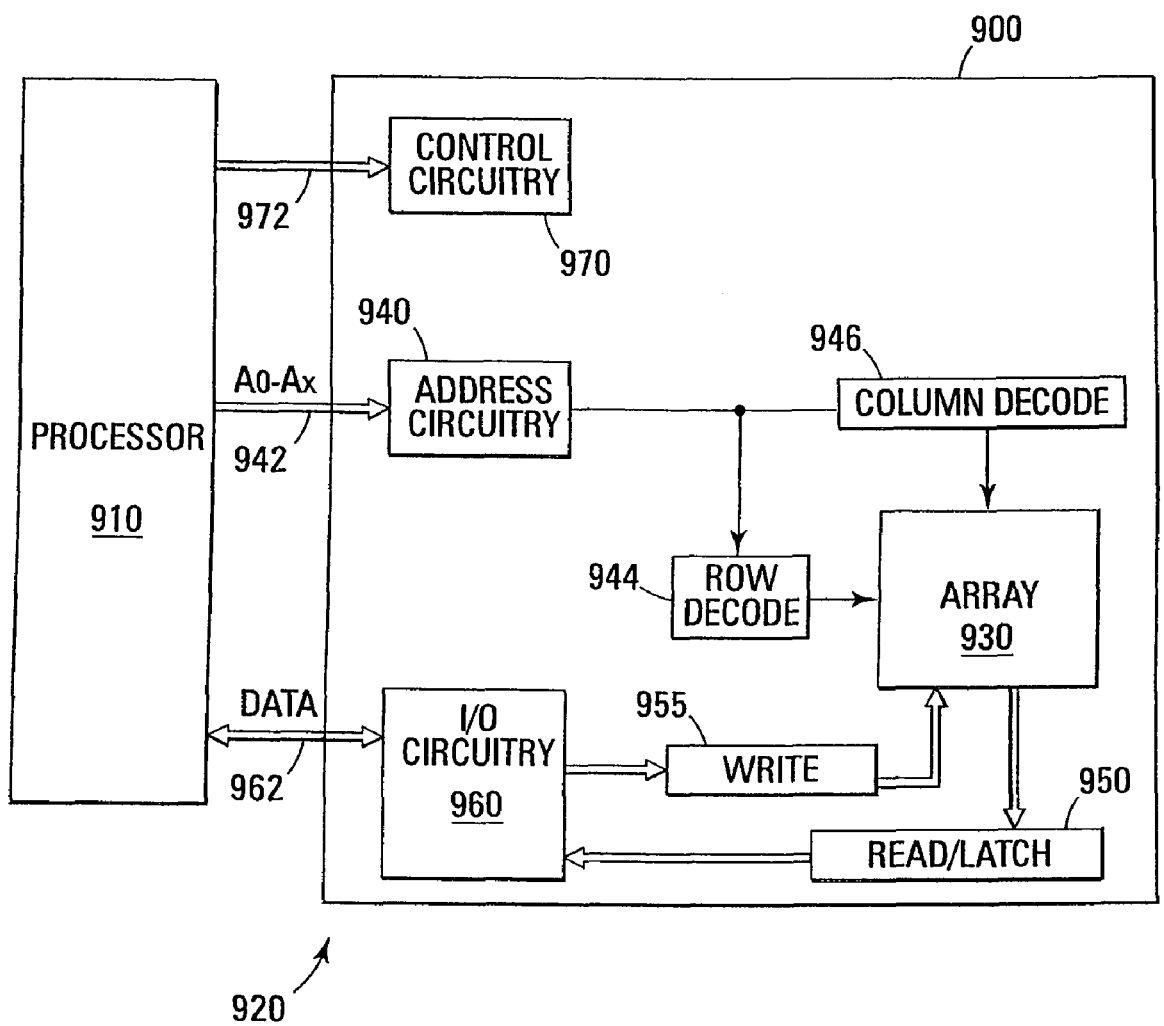
FIG. 9 is a functional block diagram of an electrical system having at least one memory device with a memory array configuration according to one embodiment.

FIG. 9 is a functional block diagram of a memory device 900, such as a flash memory device, of one embodiment of the present invention, which is coupled to a processor 910. The memory device 900 and the processor 910 may form part of an electronic system 920. The memory device 900 has been simplified to focus on features of the memory that are helpful in understanding the present invention. The memory device includes an array of memory cells 930 having suspended gate non-volatile memory cells such as those shown in FIGS. 1-8 and described above. The memory array 930 is arranged in banks of rows and columns.

An address buffer circuit 940 is provided to latch address signals provided on address input connections A0-Ax 942. Address signals are received and decoded by row decoder 944 and a column decoder 946 to access the memory array 930. It will be appreciated by those skilled in the art, with the benefit of the present description, that the number of address input connections depends upon the density and architecture of the memory array. That is, the number of addresses increases with both increased memory cell counts and increased bank and block counts.

The memory device reads data in the array 930 by sensing voltage or current changes in the memory array columns using sense/latch circuitry 950. The sense/latch circuitry, in one embodiment, is coupled to read and latch a row of data from the memory array. Data input and output buffer circuitry 960 is included for bi-directional data communication over a plurality of data (DQ) connections 962 with the processor 910, and is connected to write circuitry 955 and read/latch circuitry 950 for performing read and write operations on the memory 900.

Command control circuit 970 decodes signals provided on control connections 972 from the processor 910. These signals are used to control the operations on the memory array 930, including data read, data write, and erase operations. The flash memory device has been simplified to facilitate a basic understanding of the features of the memory. A more detailed understanding of internal circuitry and functions of flash memories are known to those skilled in the art.

Figure 10:
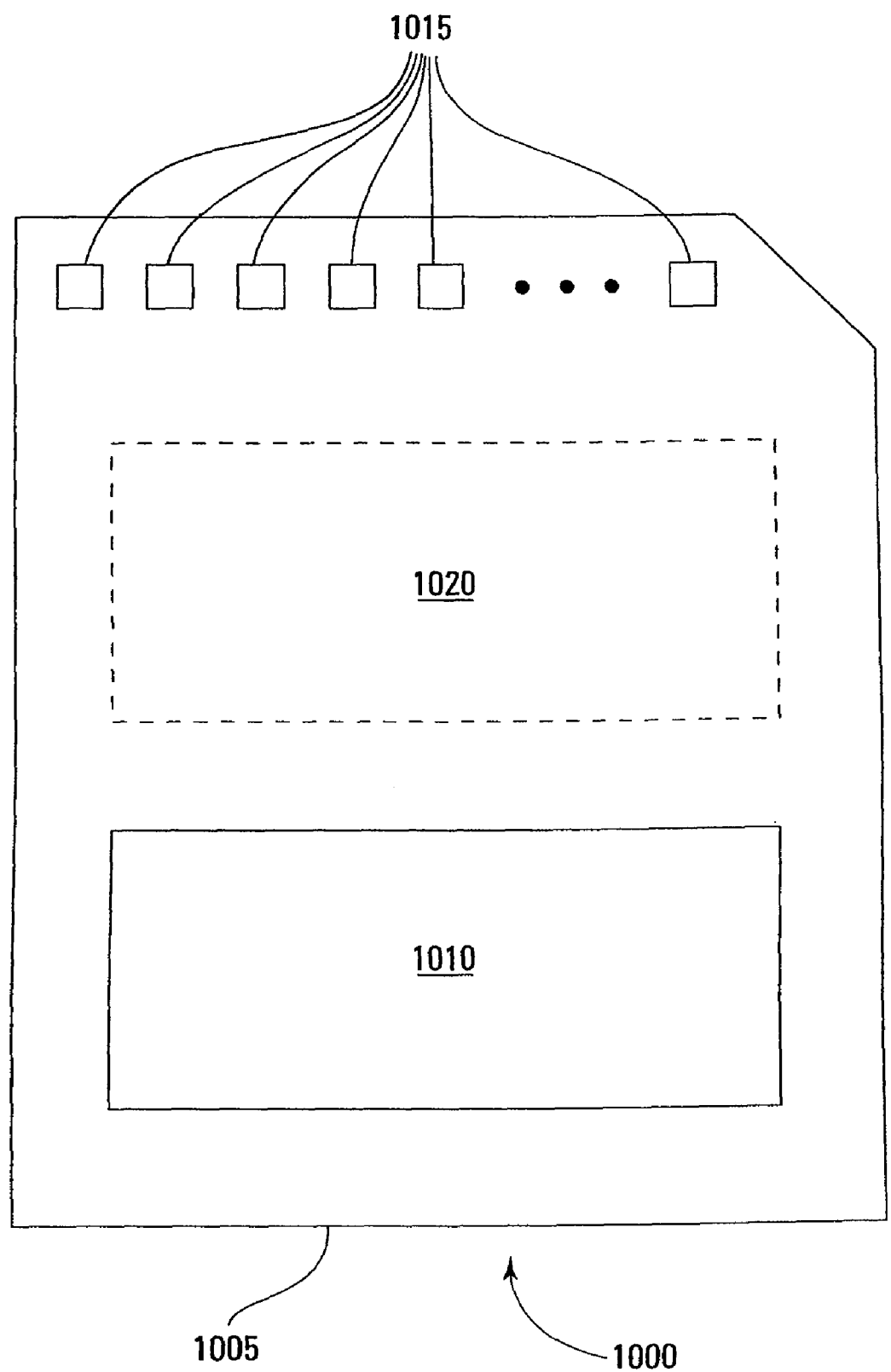
FIG. 10 is a functional block diagram of a memory module having at least one memory device in accordance with another embodiment.

FIG. 10 is an illustration of an exemplary memory module 1000. Memory module 1000 is illustrated as a memory card, although the concepts discussed with reference to memory module 1000 are applicable to other types of removable or portable memory, e.g., USB flash drives, and are intended to be within the scope of "memory module" as used herein. In addition, although one example form factor is depicted in FIG. 10, these concepts are applicable to other form factors as well.

In some embodiments, memory module 1000 will include a housing 1005 (as depicted) to enclose one or more memory devices 1010, though such a housing is not essential to all devices or device applications. At least one memory device 1010 is a non-volatile memory including suspended gate non-volatile memory cells and arrays according to various embodiments of the present invention. Where present, the housing 1005 includes one or more contacts 1015 for communication with a host device. Examples of host devices include digital cameras, digital recording and playback devices, PDAs, personal computers, memory card readers, interface hubs and the like. For some embodiments, the contacts 1015 are in the form of a standardized interface. For example, with a USB flash drive, the contacts 1015 might be in the form of a USB Type-A male connector. For some embodiments, the contacts 1015 are in the form of a semi-proprietary interface. In general, however, contacts 1015 provide an interface for passing control, address and/or data signals between the memory module 1000 and a host having compatible receptors for the contacts 1015.

The memory module 1000 may optionally include additional circuitry 1020 which may be one or more integrated circuits and/or discrete components. For some embodiments, the additional circuitry 1020 may include a memory controller for controlling access across multiple memory devices 1010 and/or for providing a translation layer between an external host and a memory device 1010. For example, there may not be a one-to-one correspondence between the number of contacts 1015 and a number of I/O connections to the one or more memory devices 1010. Thus, a memory controller could selectively couple an I/O connection (not shown in FIG. 10) of a memory device 1010 to receive the appropriate signal at the appropriate I/O connection at the appropriate time or to provide the appropriate signal at the appropriate contact 1015 at the appropriate time. Similarly, the communication protocol between a host and the memory module 1000 may be different than what is required for access of a memory device 1010. A memory controller could then translate the command sequences received from a host into the appropriate command sequences to achieve the desired access to the memory device 1010. Such translation may further include changes in signal voltage levels in addition to command sequences.

The additional circuitry 1020 may further include functionality unrelated to control of a memory device 1010 such as logic functions as might be performed by an ASIC (application specific integrated circuit). Also, the additional circuitry 1020 may include circuitry to restrict read or write access to the memory module 1000, such as password protection, biometrics or the like. The additional circuitry 1020 may include circuitry to indicate a status of the memory module 1000. For example, the additional circuitry 1020 may include functionality to determine whether power is being supplied to the memory module 1000 and whether the memory module 1000 is currently being accessed, and to display an indication of its status, such as a solid light while powered and a flashing light while being accessed. The additional circuitry 1020 may further include passive devices, such as decoupling capacitors to help regulate power requirements within the memory module 1000.

Figure 11:
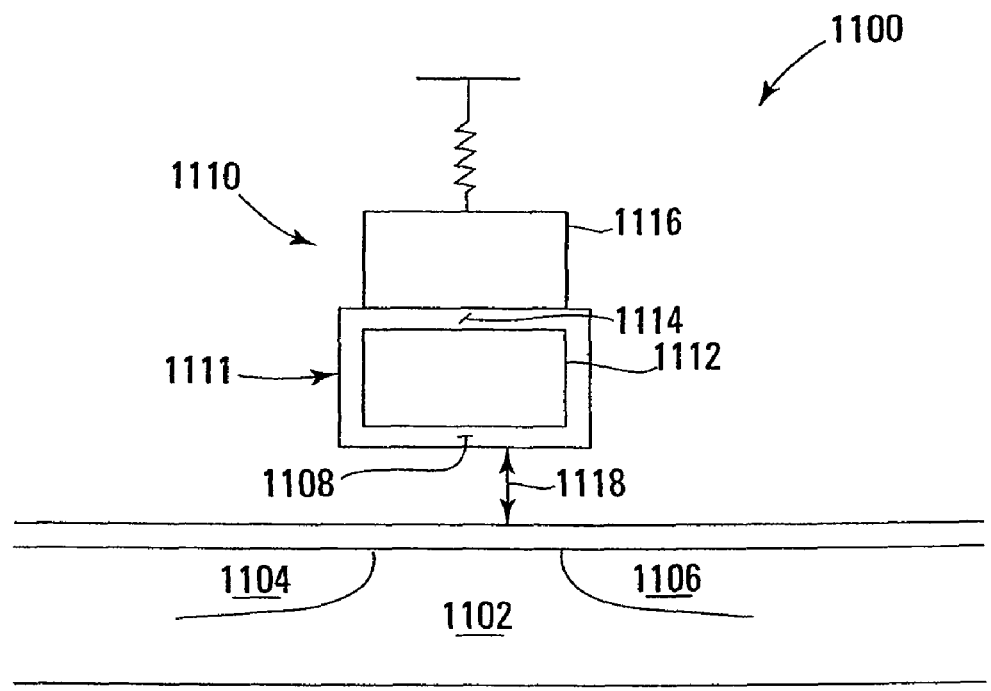
FIG. 11 is a side elevation view of another suspended gate non-volatile memory cell.

A MEM suspended gate non-volatile memory cell 1100 according to another embodiment is shown in side elevation in FIG. 11. The cell 1100 comprises a substrate 1102 having source 1104 and drain 1106 regions. A suspended structure 1110 has a carrier storage node (or floating gate) 1112 surrounded by a dielectric layer 1111, and a control gate 1116. The dielectric layer 1111 serves as a dielectric 1114 separating the carrier storage node 1114 and the control gate 1116, as well as a tunnel oxide layer 1108 which separates the substrate 1102, and source and drain regions 1104 and 1106 from the carrier storage node 1112 when the suspended portion 1110 is moved to contact the substrate 1102. There is no tunnel oxide on the substrate 1102, and the dielectric 1108 on the suspended portion 1110 serves as the tunnel oxide for the memory cell 1100. The suspended structure 1110 is movable between a first position with an air or vacuum gap 1118 between the tunnel oxide 1108 and the substrate 1102, and a second position in which the suspended structure tunnel oxide 1108 contacts the substrate 1102.

Figure 12:
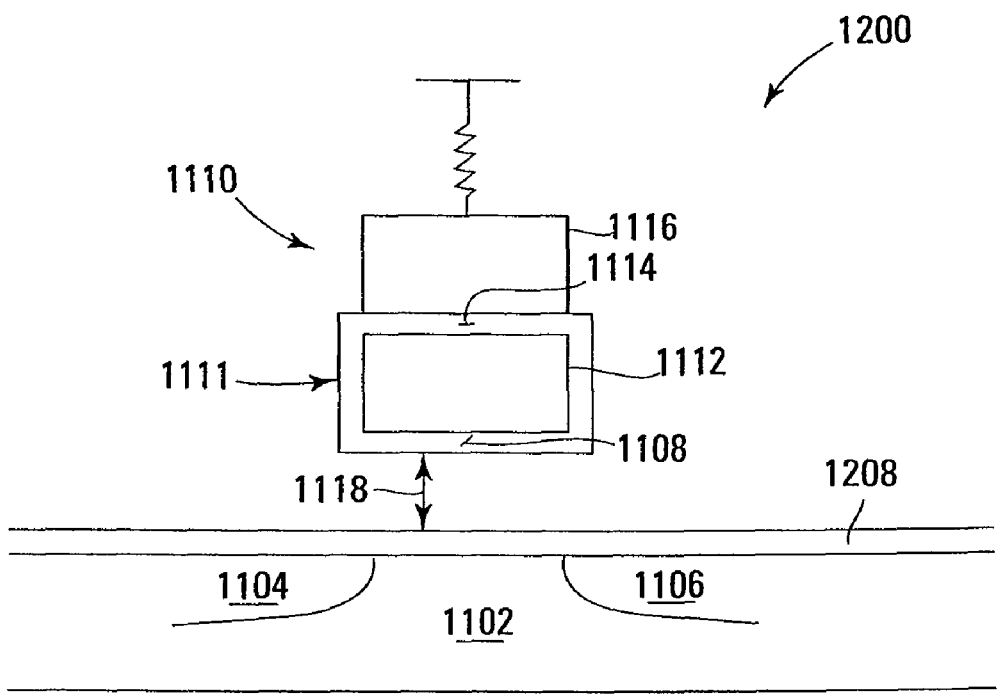
FIG. 12 is a side elevation view of yet another suspended gate non-volatile memory cell.

Another MEM suspended gate non-volatile memory cell 1200 shown in FIG. 12 differs from memory cell 1100 only in that a tunnel oxide layer 1208 is also present over the substrate 1102, source 1104, and drain 1106 regions.

CONCLUSION

A suspended gate non-volatile memory cell and array structures of cells have been described that include a carrier storage node on a suspended portion of a suspended gate MEM type structure.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A non-volatile suspended gate memory array, comprising:
    an array of suspended gate memory cells arranged in rows and columns and accessed by bitlines and word lines;
    control circuitry to read, program, and erase the memory cells; and
    address circuitry to latch address signals provided on address input connections; wherein each memory cell comprises:
        a substrate having a pull-in/pull-out gate, source and drain regions, and a dielectric over the substrate; and
        a suspended gate having a carrier storage node and a control gate thereon, the suspended gate movable between a first position in which it is separated from the substrate by a gap, and a second position in which it contacts the dielectric.

2. The non-volatile suspended gate memory array of claim 1, wherein the pull-in/pull-out gate is configured to control movement of the suspended gate between the first position and the second position.

3. The non-volatile suspended gate memory array of claim 1, wherein the suspended gate is moved to the first position by an application of a voltage to the pull-in/pull-out gate and to the second position by an application of another voltage to the pull-in/pull-out gate.

4. The non-volatile suspended gate memory array of claim 1, wherein the carrier storage node is a floating gate.

5. The non-volatile suspended gate memory array of claim 1, wherein the control gate of the memory cells of each row of memory cells is common to memory cells of the respective row of memory cells, and wherein there is a common control gate for each word line.

6. A method of operating a suspended gate non-volatile memory cell, comprising:
moving a suspended gate having a carrier storage node and a control gate separated by a dielectric between a first position in which a gap separates the carrier storage node and a tunnel oxide covered substrate and a second position in which the carrier storage node contacts the tunnel oxide.

7. The method of claim 6, wherein the suspended gate is moved to the first position when no operation is being performed on the memory.

8. The method of claim 6, wherein the suspended gate is moved to the second position when a program, read, or erase operation is being performed on the memory.

9. The method of claim 6, wherein the suspended gate is moved to the first position by an application of a pull-out voltage to a pull-in/pull-out gate in the substrate.

10. The method of claim 6, wherein the suspended gate is moved to the second position by an application of a pull-in voltage to a pull-in/pull-out gate in the substrate.

11. The method of claim 6, and further comprising:
programming the cell by moving the suspended gate to the second position; applying set of program voltages to the control gate and a drain and a source of the cell; and injecting electrons from an active area of the substrate to the carrier storage node.

12. The method of claim 11, wherein moving the suspended gate to the second position comprises applying a pull-in voltage to a pull-in/pull-out gate in the substrate.

13. The method of claim 6, and further comprising:
reading the cell by moving the suspended gate to the second position; applying a set of read voltages to the control gate, a source and a drain of the cell, and the substrate; and reading a program state of the carrier storage node.

14. The method of claim 13, wherein moving the suspended gate to the second position comprises applying a pull-in voltage to a pull-in/pull-out gate in the substrate.

15. The method of claim 6, and further comprising:
erasing the cell by moving the suspended gate to the second position; applying a set of erase voltages to the control gate and the substrate; floating a source and a drain; and ejecting electrons from the carrier storage node to the substrate.

16. The method of claim 15, wherein moving the suspended gate to the second position comprises applying a pull-in voltage to a pull-in/pull-out gate in the substrate.

17. A memory device, comprising:
an array of suspended gate memory cells arranged in rows and columns such that the rows are each coupled to a word line and the columns are each coupled to a bitline;
control circuitry to read, write and erase the memory cells;
address circuitry to latch address signals provided on address input connections;
wherein each memory cell comprises:
a substrate having a pull-in/pull-out gate, source and drain regions, and a tunnel oxide over the substrate; and
a suspended gate having a carrier storage node, a control gate, and a dielectric separating the carrier storage node and the control gate, the suspended gate movable between a first position having a gap between the carrier storage node and the tunnel oxide, and a second position having no gap between the carrier storage node and the tunnel oxide.

18. The memory device of claim 17, wherein the pull-in/pull-out gate is configured to control movement of the suspended gate between the first position and the second position.

19. The memory device of claim 17, wherein the control gate of the memory cells of each row of memory cells is common to memory cells of the respective row of memory cells, wherein each wordline has associated with it a plurality of carrier storage nodes controlled by a control gate common to memory cells of a respective row of memory cells.

20. The memory device of claim 17, wherein the suspended gate is configured to move to the first position when no operation is being performed on the memory device and to move to the second position when a program, read, or erase operation is being performed on the memory device.

21. A flash memory module, comprising:
a housing having a plurality of contacts; and
one or more flash memory devices enclosed in the housing and selectively coupled to the plurality of contacts;
wherein at least one of the memory devices comprises:
an array of non-volatile memory cells arranged in rows and columns and accessed by bitlines and word lines;
control circuitry to read, write and erase the memory cells; and
address circuitry to latch address signals provided on address input connections;
wherein each memory cell comprises:
a suspended gate having a carrier storage node, a control gate, and a dielectric separating the carrier storage node and the control gate, the suspended gate movable between a first position having a gap between the carrier storage node and a tunnel oxide formed on a substrate of the at least one of the memory devices, and a second position having no gap between the carrier storage node and the tunnel oxide.

22. The flash memory module of claim 21, wherein the suspended gate is configured to move to the first position when no operation is being performed on the memory device and to move to the second position when a program, read, or erase operation is being performed on the memory device.

23. The flash memory module of claim 21, wherein the at least one of the memory devices father comprises a pull-in/pull-out gate configured to control movement of the suspended gate between the first position and the second position.

24. The flash memory module of claim 23, wherein the suspended gate is moved to the first position by an application of a voltage to the pull-in/pull-out gate and to the second position by an application of another voltage to the pull-in/pull-out gate.

25. The flash memory module of claim 21, wherein a common control gate for each word line is common to the memory cells of a row of memory cells corresponding to the respective word line.

* * * * *

UNITED STATES PATENT AND TRADEMARK OFFICE
CERTIFICATE OF CORRECTION

PATENT NO.        : 7,751,236 B2
APPLICATION NO.   : 12/398789
DATED             : July 6, 2010
INVENTOR(S)       : Seiichi Aritome Page 1 of 1

It is certified that error appears in the above-identified patent and that said Letters Patent is hereby corrected as shown below:

In column 1, line 9, after "7,511,994" delete "(allowed)".

In column 8, line 48, in Claim 23, delete "father" and insert -- further --, therefor.

Signed and Sealed this

Fourteenth Day of September, 2010

David J. Kappos
*Director of the United States Patent and Trademark Office*